United States Patent
Zhou et al.

(12) 
(10) Patent No.: US 6,521,972 B1
(45) Date of Patent: Feb. 18, 2003

(54) RF POWER TRANSISTOR HAVING LOW PARASITIC IMPEDANCE INPUT FEED STRUCTURE

(75) Inventors: Wei-Shu Zhou, Fremont, CA (US); Shuo-Yuan Hsiao, Milpitas, CA (US); Nanlei Larry Wang, Palo Alto, CA (US)

(73) Assignee: EiC Corporation, Fremont, CA (US)

( * ) Notice: Subject to any disclaimer, the term of this patent is extended or adjusted under 35 U.S.C. 154(b) by 0 days.

(21) Appl. No.: 09/675,098

(22) Filed: Sep. 28, 2000

(51) Int. Cl.[7] ............... H01L 27/082; H01L 27/102; H01L 29/70; H01L 31/11

(52) U.S. Cl. ............... 257/566; 438/205; 438/313; 438/340

(58) Field of Search .............. 257/341, 343, 257/566, 575, 579, 587, 593, 602, 192, 197, 200, 201, 207, 396, 529, 291, 59, 407

(56) References Cited

U.S. PATENT DOCUMENTS

| | | | | |
|---|---|---|---|---|
| 3,651,434 A | * | 3/1972 | McGeough et al. | 333/84 M |
| 5,939,789 A | * | 8/1999 | Kawai et al. | 257/758 |
| 6,114,716 A | * | 9/2000 | Boles et al. | 257/207 |
| 6,246,102 B1 | * | 6/2001 | Sauerbrey et al. | 257/529 |
| 6,310,362 B1 | * | 10/2001 | Takemura | 257/59 |
| 6,310,372 B1 | * | 10/2001 | Katayama et al. | 257/291 |
| 6,351,133 B1 | * | 2/2002 | Jones et al. | 324/754 |

FOREIGN PATENT DOCUMENTS

| | | | |
|---|---|---|---|
| GB | 2258563 A | * | 2/1993 |
| JP | 58032450 A | * | 2/1983 |

OTHER PUBLICATIONS

Ben G. Streetman and Sanjay Banerjee, Solid State Electronic Devices 2000, Prentice Hall, Inc., Fifth Edition, pp. 18–19.*

* cited by examiner

*Primary Examiner*—Olik Chaudhuri
*Assistant Examiner*—Dana Farahani
(74) *Attorney, Agent, or Firm*—Townsend and Townsend and Crew LLP; Henry K. Woodward

(57) ABSTRACT

An RF microwave power transistor has an input/output feed structure which functions as a low impedance microstrip line by providing a ground plane in close proximity to the feed structure on one surface of a semiconductor body. A second ground plane can be provided on an opposing surface of the semiconductor body with vias interconnecting the first and second ground planes. In addition to reducing feed impedance, a larger total transistor size can be provided before "odd mode oscillation" occurs.

19 Claims, 2 Drawing Sheets

RF POWER TRANSISTOR HAVING LOW PARASITIC IMPEDANCE INPUT FEED STRUCTURE

BACKGROUND OF THE INVENTION

This invention relates generally to RF power transistors, and more particularly the invention relates to providing a low parasitic impedance input/output feed structure in a distributed power transistor.

Power transistors (MESFET, MOSFET, BIPOLAR, HBT) for RF and Microwave frequencies are made of multiple building blocks or individual transistors which are driven in parallel with the outputs of the transistors combined as the power output. A commonly used drive structure is the "divide-by-two" feed, which is used over and again as shown in FIG. 1. In FIG. 1, the input signal is applied at terminal 10 with the feed path 12 divided by 2 as many times as necessary to drive the individual transistors 14. The "divide-by-two" pattern can be used several times as long as each path has equal input length to the individual transistors. The input terminals of transistors 14 can be interconnected also by line 15. The output side is "power combined" by the same structure in reverse order.

The high frequency response of a transistor is affected strongly by the input capacitance to the transistor, which is the gate to source capacitance in a field effect transistor and a base-to-emitter capacitance in BIPOLAR and HBT transistors. Therefore, the standard rule of thumb has been to avoid the overlap of the feed structure to any source or emitter electrode connection and thereby minimize the input capacitance.

The feed structure represents a large inductance in a high power transistor with the input inductance adversely effecting the input matching circuit bandwidth. Also, an "odd mode" oscillation can occur with a large input and output impedance among the building block transistors as illustrated in FIG. 2. As shown in FIG. 2, the input at contact 10 is applied through inductors 12 to the base of transistors 14, the output is taken at the collectors and applied through inductors 18 to the output terminal 20. As illustrated by the dotted signal configuration 22, the inductive feed can cause an oscillation with the input signal at transistors 14 being 180° out of phase thereby canceling the signal of the transistors at input 10 and output 20.

The present invention is directed to an improved low inductance power feed structure and in which possible "odd mode" operation is reduced.

SUMMARY OF THE INVENTION

In accordance with the invention, the input/output feed structure to the plurality of transistor elements in an RF power transistor is placed in close proximity to a ground plane whereby the feed structure functions as a low impedance microstrip line in feeding each of the transistor elements. The ground plane is connected through vias, for example, to a backside ground plane on the bottom of the transistor semiconductor chip.

More particularly, an RF power transistor includes a semiconductor body having a plurality of individual transistors therein, a first ground plane on a bottom surface of the semiconductor body and a second ground plane on a top surface of the semiconductor body which is electrically connected to the first ground plane and to which common elements of individual transistors are connected. A dielectric insulating layer is provided over the second ground plane, and a feed structure is then formed on the insulating layer and overlying the second ground plane, the feed structure preferably comprising a metal layer which has been selectively patterned to form the feedlines to the individual transistors.

The semiconductor body can comprise silicon or a III–IV semiconductor material such as gallium arsenide or indium phosphide. The insulating layer is preferably silicon oxide, silicon nitride, polyimide, or a combination thereof. The individual transistor elements can be a MESFET, MOSFET, BIPOLAR or HETROJUNCTION BIPOLAR transistor (HBT).

Not only is the parasitic impedance provided by the microstrip line reduced, but also total transistor size can be increased before the "odd mode oscillation" occurs.

The invention and objects and features thereof will be more readily apparent from the following detailed description and dependent claims when taken with the drawings.

BRIEF DESCRIPTION OF THE DRAWINGS

Like elements in the several figures have the same reference numerals.

DETAILED DESCRIPTION OF ILLUSTRATIVE EMBODIMENTS

Figure 1:
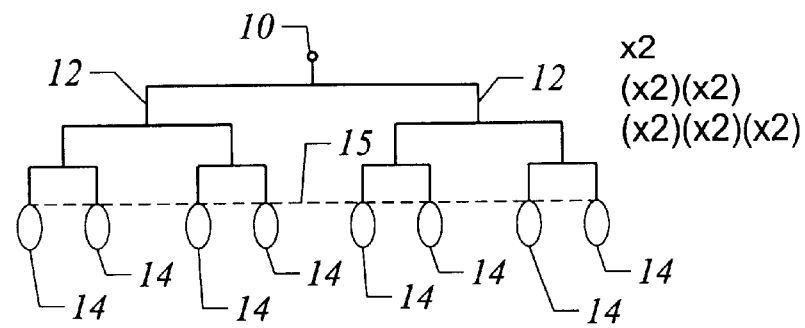
FIG. 1 is a schematic of conventional divide-by-two structure for a RF power transistor.
Figure 2:
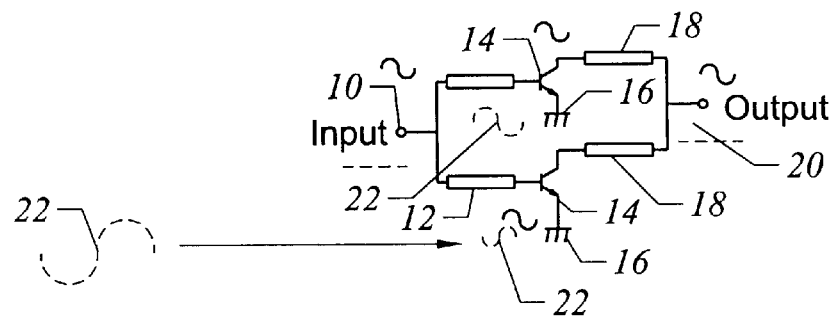
FIG. 2 is a schematic of two transistor elements of a RF power transistor illustrating the "odd ode" transistor operation.
Figure 3:
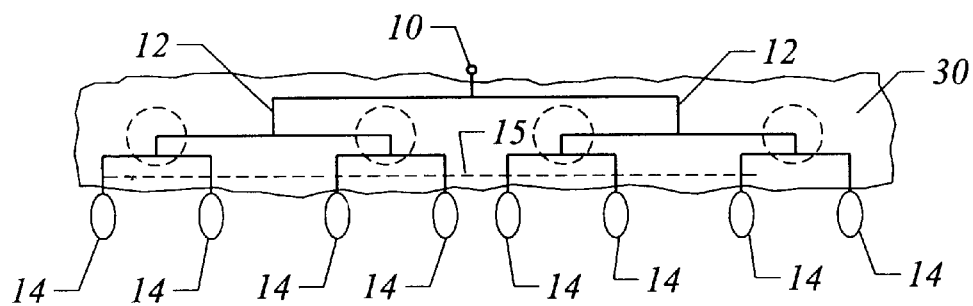
FIG. 3 is a schematic representation of a feed structure in accordance with an embodiment of the present invention.

Referring now to FIG. 3, a feed structure similar to that illustrated in FIG. 1, is modified in accordance with an embodiment of the invention. Again, the input lines 12 provide electrical signals from an input terminal 10 to the plurality of transistor elements 14, with the inputs of the individual transistor elements 14 further interconnected by an optional connection 15. In accordance with the invention, a ground plane 30 is placed in close proximity to the feedlines 12 whereby the feedlines function as a low impedance microstrip in connecting the input terminal 10 to the transistor elements 14. In a preferred embodiment, the ground plane 30 to which common elements of the transistors 14 are connected is provided on a top surface of a semiconductor body and is electrically connected with a second ground plane on the bottom surface of the semiconductor body. Ground plane 30 can be selectively etched for positioning only under the feedlines if desired to reduce capacitance. The same feed structure applies to the output side of the transistor as well.

Figure 4:
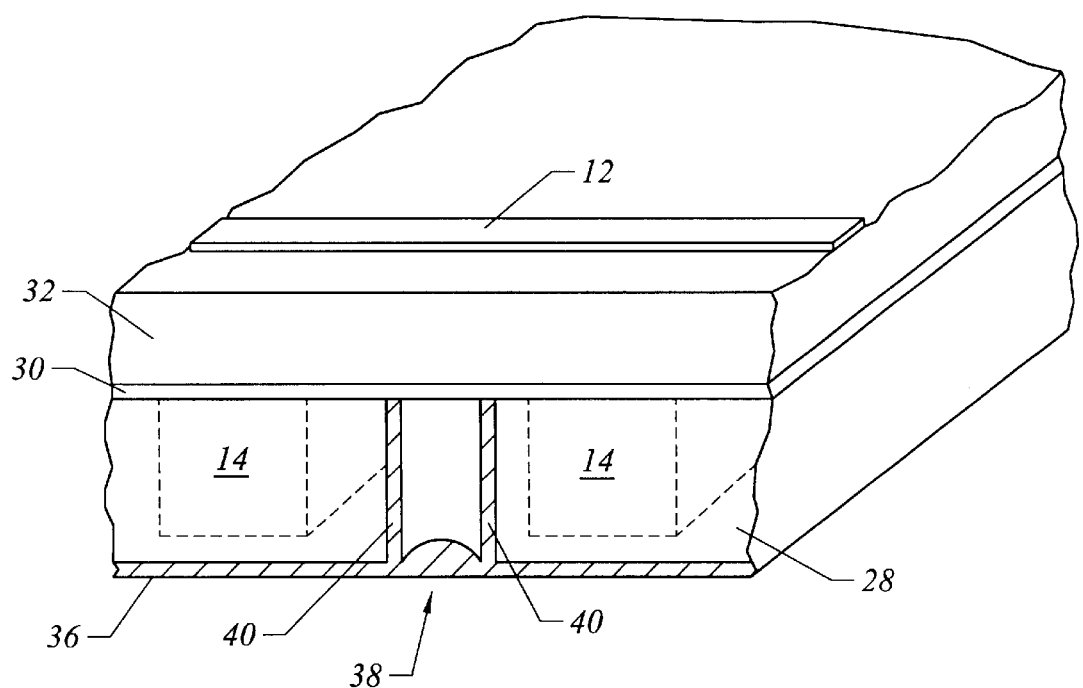
FIG. 4 is a perspective view in section illustrating the feed structure and ground planes in accordance with one embodiment of the invention.

FIG. 4 is a perspective view partially in section further illustrating the layout of metal layer 30 on the top surface of a semiconductor body 28 with a dielectric layer 32 separating metal layer 30 from the input line 12. While the substrate is typically 50–150 microns in thickness, the dielectric layer can be on the order of 2 microns or less in thickness. A via 38 through semiconductor body 28 has a metal coating 40 (e.g. plated gold) electrically connecting top ground layer 30 to the bottom surface ground layer 36. The ground layers preferably comprise a suitable metal for the semiconductor body such as aluminum or a refractory metal with dielectric layer 32 comprising silicon oxide, silicon nitride, polyimide or a combination thereof. The transistor elements 14 are fabricated in semiconductor body 28 using known processing techniques with the common terminals (e.g. common source, common emitter) connected to the top ground plane 30.

While the thin dielectric layer 32 will cause large overlap capacitance between the feed line and the top ground plane 30, which by conventional teachings would be detrimental to circuit operation, the feed structure forms a low impedance transmission line or low impedance microstrip which in fact reduces the impedance of the RF transistor input/output feed structure. With the same physical length, but closely overlapping the front side ground layer, the feed structure comprises a low impedance transmission line with the end result being a low inductance feed. The equivalent inductance is proportional to the product of impedance and electrical length when the total length is a fraction of the operating frequency wavelength. Since the dielectric layer usually has a lower dielectric constant (4 to 7) than the substrate (10–13 for silicon, gallium arsenide, indium phosphide, and other III–V materials), the electrical length of the same physical structure is also shorter. Therefore, the impedance and electrical length are reduced which reduces the feed impedance. Moreover, the low feed impedance helps in providing a broadband frequency input matching, and the low impedance feed structure allows a larger total transistor size before the "odd mode oscillation" occurs.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. An RF power transistor comprising:
   a) a semiconductor body having a plurality of individual transistors therein,
   b) a first ground plane on a bottom surface of the semiconductor body,
   c) a second ground plane on a top surface of the semiconductor body which is electrically connected to the first ground plane and to which common elements of the individual transistors are connected,
   d) an insulating layer over the second ground plane, and
   e) a feed structure on the insulating layer and overlying the second ground plane and the transistors, the feed structure forming a low impedance microstrip line with the second ground plane with the microstrip line driving the individual transistors.

2. The RF power transistor as defined by claim 1 and including vias through the semiconductor body for electrically connecting the first ground plane and the second ground plane.

3. The RF power transistor as defined by claim 2 wherein the individual transistors are selected from the group consisting of MESFETs, MOSFETs, Bipolar transistors and hetrojunction bipolar transistors.

4. The RF power transistor as defined by claim 3 wherein the power transistor is operated at microwave frequencies.

5. The RF power transistor as defined by claim 4 wherein the insulating layer comprises silicon oxide.

6. The RF power transistor as defined by claim 4 wherein the insulating layer comprises silicon nitride.

7. The RF power transistor as defined by claims 4 wherein the insulating layer comprises polyimide.

8. The RF power transistor as defined by claim 4 wherein the dielectric layer has a dielectric constant below 10.

9. The RF power transistor as defined by claim 8 wherein the semiconductor body has a dielectric constant between 10 and 13.

10. The RF power transistor as defined by claim 8 wherein the semiconductor body comprises silicon.

11. The RF power transistor as defined by claim 8 wherein the semiconductor body comprises GaAs.

12. The RF power transistor as defined by claim 8 wherein the semiconductor body comprises InP.

13. The RF power transistor as defined by claim 8 wherein the semiconductor body comprises a III–V semiconductor material.

14. The RF power transistor as defined by claim 1 wherein the feed structure comprises a metal layer which has been selectively patterned to form feed lines to the individual transistors.

15. An RF microwave power transistor comprising:
   a) a semiconductor body having a plurality of individual transistors therein, said transistors being selected from the group consisting of MESFETs, MOSFETs, BIPOLAR, and HBT,
   b) a first ground plane on a bottom surface of the semiconductor body,
   c) a second ground plane on a top surface of the semiconductor body which is electrically connected to the first ground plane by vias extending through the semiconductor body and to which common elements of the individual transistors are connected,
   d) an insulating layer over the second ground plane, and
   e) a low impedance microstrip feed structure on the insulating layer and overlying the second ground plane and transistors, the feed structure comprising a metal layer which has been selectively etched to form feedlines to the individual transistors.

16. The RF microwave power transistor as defined by claim 15 wherein the dielectric layer has a dielectric constant below 10.

17. The RF microwave power transistor as defined by claim 16 wherein the dielectric layer is selected from the group consisting of silicon oxide, silicon nitride, and polyimide.

18. The RF microwave power transistor as defined by claim 16 wherein the semiconductor body has a dielectric constant between approximately 10 and 13.

19. The RF power microwave transistor as defined by claim 18 wherein the semiconductor body is selected in the group consisting of silicon and III–V semiconductor material.

* * * * *